United States Patent
Han

(10) Patent No.: US 10,031,565 B1
(45) Date of Patent: Jul. 24, 2018

(54) HEAT DISSIPATION STRUCTURE OF ADDIN CARD

(71) Applicant: EVGA CORPORATION, New Taipei (TW)

(72) Inventor: Tai-Sheng Han, New Taipei (TW)

(73) Assignee: EVGA CORPORATION, New Taipei (TW)

( * ) Notice: Subject to any disclaimer, the term of this patent is extended or adjusted under 35 U.S.C. 154(b) by 0 days.

(21) Appl. No.: 15/456,573

(22) Filed: Mar. 12, 2017

(30) Foreign Application Priority Data

Jan. 6, 2017 (TW) .............................. 106200259 U

(51) Int. Cl.
*G06F 1/20* (2006.01)
*H01L 23/427* (2006.01)
*H01L 23/367* (2006.01)
*H05K 7/20* (2006.01)

(52) U.S. Cl.
CPC ............ *G06F 1/20* (2013.01); *H01L 23/3672* (2013.01); *H01L 23/427* (2013.01); *H05K 7/20154* (2013.01)

(58) Field of Classification Search
CPC . H01L 23/467; H01L 23/427; H01L 23/3672; H01L 23/473; H01L 21/4871; H01L 23/3677; G06F 1/20; G06F 1/203; G06F 2200/201; G06F 1/206; H05K 1/0203; H05K 7/20154; H05K 3/0061; H05K 7/20127; H05K 7/20136
See application file for complete search history.

(56) References Cited

U.S. PATENT DOCUMENTS

| | | | | |
|---|---|---|---|---|
| 5,201,866 A | * | 4/1993 | Mok | F28F 3/02 165/185 |
| 6,712,128 B1 | * | 3/2004 | Dussinger | H01L 23/4093 165/182 |
| 2003/0189815 A1 | * | 10/2003 | Lee | H01L 23/427 361/719 |
| 2005/0061477 A1 | * | 3/2005 | Mira | F04D 29/582 165/80.3 |
| 2005/0252640 A1 | * | 11/2005 | Chang | F28D 15/0266 165/80.3 |
| 2006/0260792 A1 | * | 11/2006 | Wang | F28F 1/32 165/182 |
| 2006/0266500 A1 | * | 11/2006 | Lin | H01L 23/427 165/104.33 |
| 2007/0029071 A1 | * | 2/2007 | Hwang | H01L 23/427 165/104.33 |
| 2007/0097646 A1 | * | 5/2007 | Peng | H01L 23/427 361/701 |
| 2007/0211432 A1 | * | 9/2007 | Peng | G06F 1/20 361/700 |
| 2009/0147476 A1 | * | 6/2009 | Han | G06F 1/20 361/697 |

* cited by examiner

*Primary Examiner* — Adam B Dravininkas
(74) *Attorney, Agent, or Firm* — Leong C. Lei

(57) ABSTRACT

A heat dissipation structure is provided for arrangement on an addin card and includes a plurality of heat dissipation fins arranged on the addin card, at least one bent section formed at one side of the heat dissipation fins and located on the addin card, at least one gap section formed between each bent section, and at least one first through-hole section formed in the heat dissipation fins. The heat dissipation fins allow heat to be dissipated from the addin card. The gap section and the first through-hole section of the heat dissipation fins allow air to flow therethrough and ventilate so as to enhance the effect of heat dissipation.

5 Claims, 5 Drawing Sheets

HEAT DISSIPATION STRUCTURE OF ADDIN CARD

TECHNICAL FIELD OF THE INVENTION

The present invention relates generally to a heat dissipation structure of an addin card, and more particularly to a heat dissipation structure of an addin card that comprises heat dissipation fins that dissipate heat from the addin card, where the heat dissipation fins provide an effect of air ventilation.

DESCRIPTION OF THE PRIOR ART

The progress of technology and science allow human being to develop various types of computing machines that make living easy. The most commonly used computing machines are personal computers that are almost present in each family. People use the computers to surf network for collecting data and acquiring knowledge and also for all sorts of entertainment, such as playing games, listening music, and watching movies. The computers lead human beings into a knowledge explosion era and change the living of human beings. The computer generally involves various addin cards for data processing and computation. When the addin card is put into operation, the addin card generates a large amount of heat. When the temperature of the addin card gets excessively high, the addin card gets down and stops functioning. Thus, it is common to provide a heat dissipation device on the addin card. One of the most commonly used heat dissipation devices is a heat dissipation fin. The heat dissipation fin is generally made of a metallic material and shows the property of having high thermal conductivity. By placing multiple heat dissipation fins on an addin card, additional heat generated by the addin card may be transferred to the heat dissipation fins. The multiplicity of heat dissipation fins can be used together to expand the surface area for dissipating heat so as to achieve an effect of efficient and fast removal of heat, allowing the addin card to operate normally.

However, the conventional heat dissipation fins, when put into use, suffer certain problems that may need further improvements:

The heat dissipation fins are generally provided with a fan that is positioned thereon to help dissipate heat. Increasing the number of heat dissipation fins involved helps expand the surface area thereof in contact with air and thus, the heat dissipation performance of the heat dissipation fins is improved. However, an overly increased number of heat dissipation fins may undesirably increase the size and weight of the computers, making the use of the computer inconvenient. People commonly desire computers having relatively small sizes and thus the limitation of available space makes the heat dissipation fins arranged in a very dense manner. Although the heat dissipation fins may be provided with a fan positioned thereon, the very small spacing between the heat dissipation fins make it hardly any space available for air to flow therethrough. The performance of heat dissipation is thus very poor.

Thus, it is a challenge of those devoted in this field to provide a solution to overcome such problems.

SUMMARY OF THE INVENTION

In view of the above problems and drawbacks, the present invention aims to provide a heat dissipation structure of an addin card that comprises heat dissipation fins that dissipate heat from the addin card, where the heat dissipation fins also provide an effect of air ventilation.

The primary objective of the present invention is to provide a design of a heat dissipation fin that helps dissipate heat from an addin card.

Another objective of the present invention is to provide a design of a gap to allow air to flow between heat dissipation fins to improve heat dissipation.

A further objective of the present invention is to provide a design of a first through-hole section that allows air to flow between heat dissipation fins to improve heat dissipation.

A structural arrangement adopted in the present invention to achieve the above objective comprises a plurality of heat dissipation fins arranged on an addin card. At least one bent section is formed on the heat dissipation fins and located on the addin card. At least one gap section is formed between each bent section. At least one first through-hole section is formed in the heat dissipation fins. An operation of the addin card generates a high temperature and the bent section of the heat dissipation fins conducts heat from the addin card to the heat dissipation fins. The heat dissipation fins shows a property of having high thermal conductivity. By arranging a plurality of heat dissipation fins, in a side-by-side manner, on the addin card, the surface area that the heat dissipation fins get in contact with air is increased to thereby improve the effect of heat dissipation. The gap section arranged between the bent sections and the first through-hole section formed in the heat dissipation fins help improve air flowing therebetween so that a tool, such as a fan, may be used to drive air that is heated by the heat dissipation fins away from the heat dissipation fins and to allow cool air to flow to the heat dissipation fins for heat exchange thereby generating circulation of air to achieve an effect of fast heat dissipation, allowing the addin card to maintain normal operation.

The above-described technique overcomes the drawbacks and problems of the known heat dissipation fins that air may not be allowed to flow therethrough and circulation and exchange of heated air and cool air are poor so that the efficiency of heat dissipation is low.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
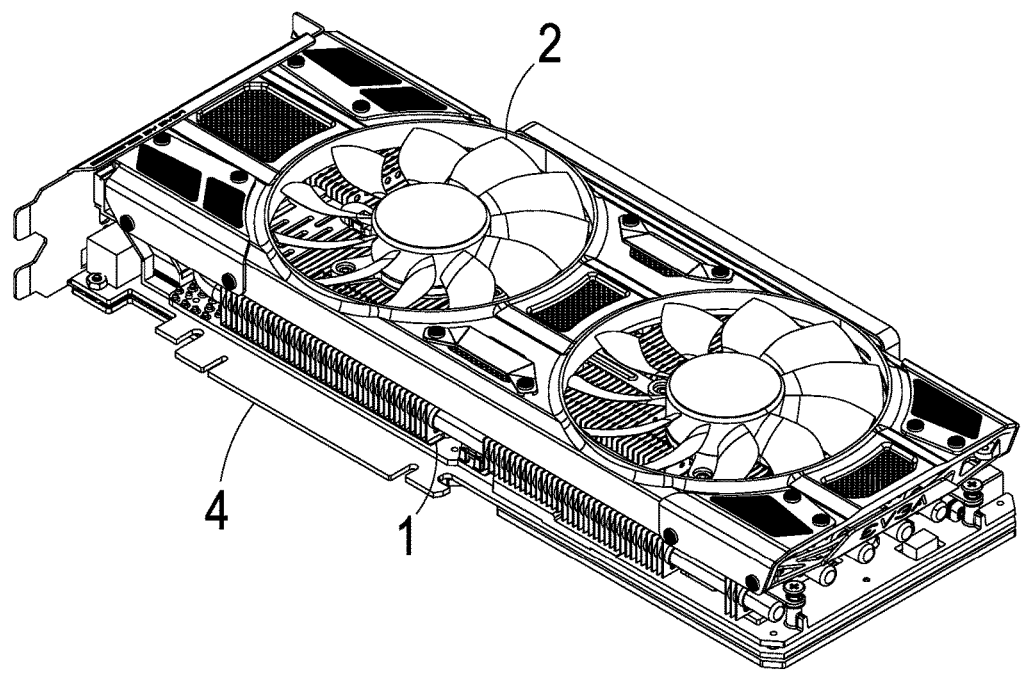
FIG. 1 is a perspective view showing a preferred embodiment of the present invention.
Figure 2:
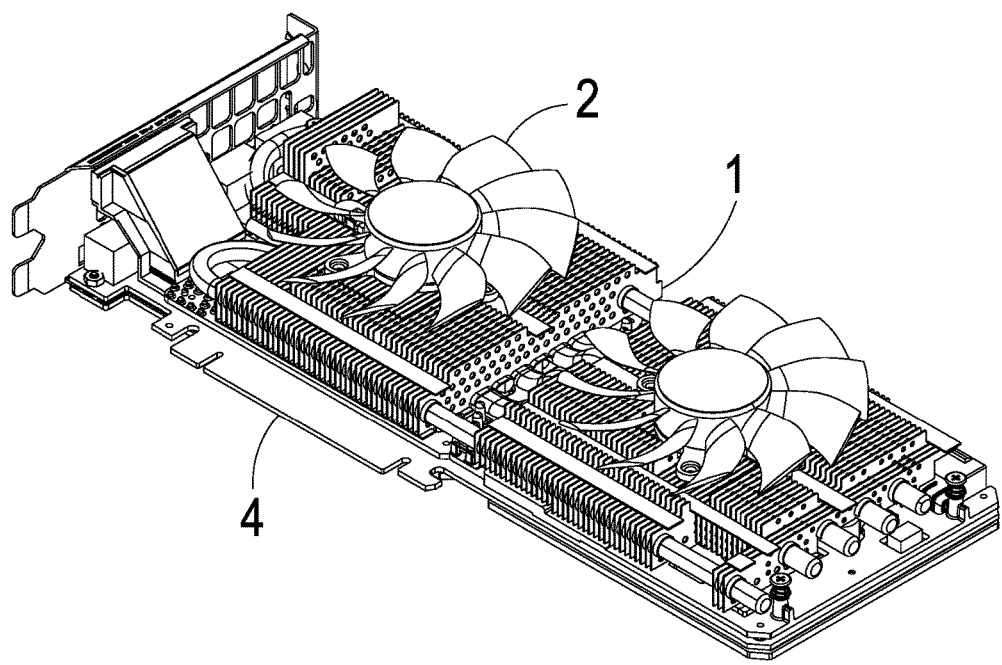
FIG. 2 is a schematic view illustrating inside details of the preferred embodiment of the present invention.
Figure 3:
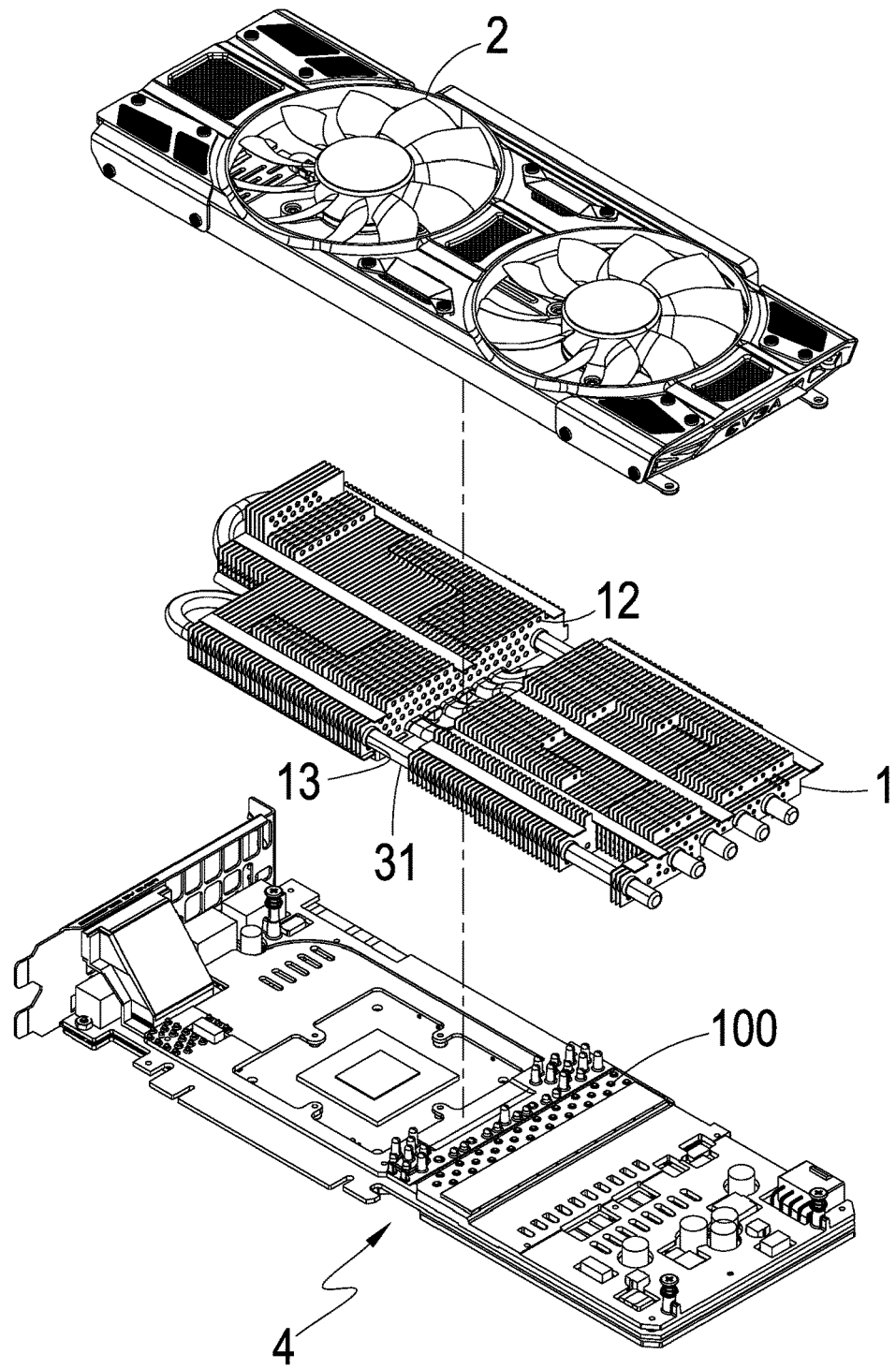
FIG. 3 is an exploded view of the preferred embodiment of the present invention.
Figure 4:
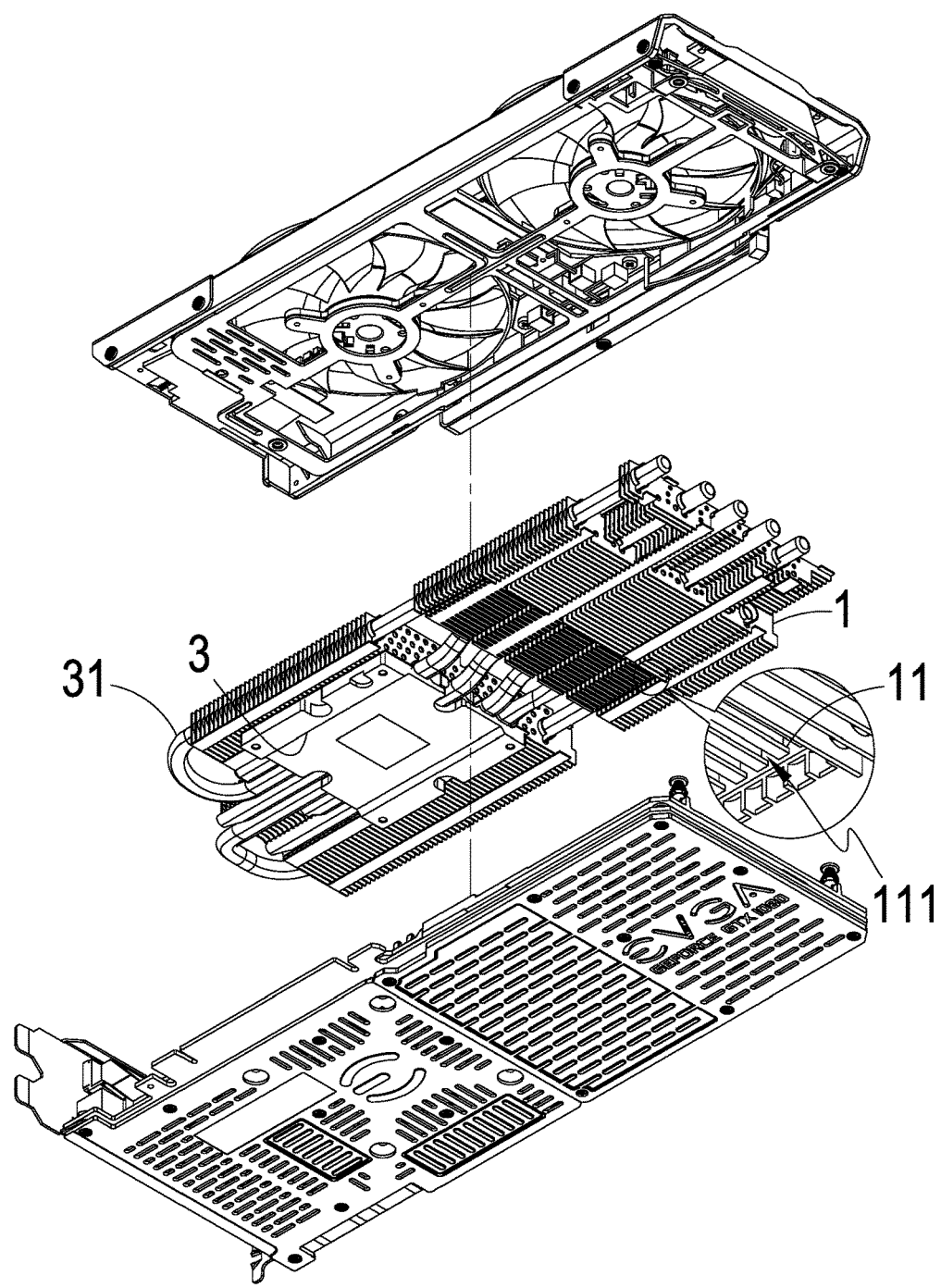
FIG. 4 is an exploded view of the preferred embodiment of the present invention taken from a different perspective.

Referring to FIGS. 1-4, which are respectively a perspective view showing a preferred embodiment of the present invention, a schematic view illustrating inside details of the preferred embodiment of the present invention, an exploded view of the preferred embodiment of the present invention, and an exploded view of the preferred embodiment of the present invention taken from a different perspective, these drawings clearly show that the present invention comprises:

a plurality of heat dissipation fins 1 arranged on an addin card 4, wherein at least one heat-conduction bottom board 100 is arranged between the heat dissipation fins 1 and the addin card 4;

at least one bent section 11 arranged at one side of the heat dissipation fins 1 and located on the addin card 4, wherein at least one gap section 111 is defined between each bent section 11 to allow air to flow therethrough;

at least one first through-hole section 12 formed in the heat dissipation fins 1 to allow air to flow therethrough, at least one second through-hole section 13 being formed in the heat dissipation fins 1, the second through-hole section 13 receiving extension of at least one heat conducting pipe 31 therethrough to couple the heat dissipation fins 1 to each other;

at least one fan 2 arranged on the heat dissipation fins; and at least one heat-conducting element 3 arranged between the heat dissipation fins 1 and the addin card 4.

Figure 5:
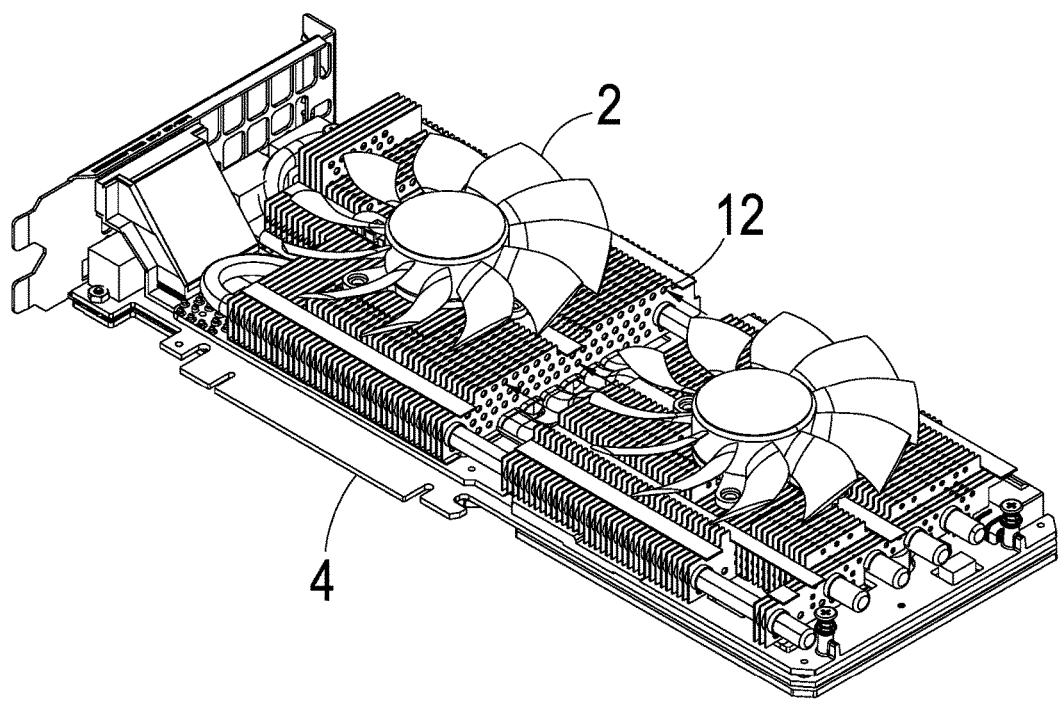
FIG. 5 is a schematic view showing an application of the preferred embodiment of the present invention.

Referring collectively to FIGS. 1-5, which are respectively a perspective view showing a preferred embodiment of the present invention, a schematic view illustrating inside details of the preferred embodiment of the present invention, an exploded view of the preferred embodiment of the present invention, an exploded view of the preferred embodiment of the present invention taken from a different perspective, and a schematic view showing an application of the preferred embodiment of the present invention, the drawings clearly show that with the above component assembled together, when the addin card 4 is put into operation, heat is generated and the addin card 4 may fail to properly function when getting over-heating, the heat dissipation fins 1 are provided on the addin card 4 for dissipating heat from the addin card 4. The heat-conducting element 3 and the heat dissipation fins 1 that are arranged on the addin card 4 are formed of metallic materials that have high thermal conductivities. The heat dissipation fins 1 are set in contact engagement with the heat-conducting element 3 so that the heat-conducting element 3 is allowed to quickly conduct heat from the addin card 4 to the heat dissipation fins 1. Further, the heat dissipation fins 1 and the addin card 4 are provided therebetween with the heat-conduction bottom board 100, which is placed in direct contact with the addin card 4 located thereunder to quick absorb heat therefrom. The bent section 11 of the heat dissipation fins 1 also helps quickly conduct heat from the addin card 4 to the heat dissipation fins 1. Through an arrangement that involves a plurality of heat dissipation fins 1 placed side by and increasing the surface area of the heat dissipation fins 1 in contact with air, efficient heat exchange with air can be achieved. The fan 2 helps circulate air so that heated air that is heated by the heat dissipation fins 1 may move away from the heat dissipation fins 1, while cold air is conducted toward the heat dissipation fins 1 for speeding up heat dissipation. In addition, the gap section 111 is provided between the bent sections 11 to allow air to flow to the heat-conduction bottom board 100. In addition, the first through-hole section 12 formed in the heat dissipation fins 1 also allows air to flow between the heat dissipation fins 1 to thereby bettering air circulation and improving heat dissipation. Further, the second through-hole section 13 receives the heat conducting pipe 31 to extend therethrough for coupling the heat dissipation fins 1 to each other and the heat conducting pipe 31 is also in contact with air to transfer heat from the heat dissipation fins 1 to air to improve the effect of heat dissipation, keeping the addin card 4 cool for normal operation. (The instant embodiment is shown comprising a heat-conduction bottom board 100; however, it is possible to omit the heat-conduction bottom board 100, and in such a case, air may flow through the gap section 111 of the heat dissipation fins 1 to the addin card 4 to help dissipate heat from the addin card 4.)

The example provided previously is concerned about just a preferred way of embodying the present invention and is not intended to impose limitations to the scope of the present invention. Minor modifications and variations that do not depart from the inventive idea of the present invention as defined in the attached claims, are considered within the scope of the present invention.

Thus, with reference to all the drawings, when put into use, the present invention provides, compared to the prior art, the following advantages:

(1) The design of the heat dissipation fins 1 helps dissipate heat from the addin card 4.

(2) The design of the gap section 111 allows air to flow between the heat dissipation fins 1 to help increase dissipation of heat.

(3) The design of the first through-hole section 12 allows air to flow between the heat dissipation fins 1 to help increase dissipation of heat.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the claims of the present invention.

I claim:

1. A heat dissipation structure of an addin card, comprising:

a plurality of heat dissipation fins arranged on an addin card, each of the heat dissipation fins comprising a plate defining a plane extending in a vertical direction and having a top edge and an opposite bottom edge in the vertical direction, the plurality of heat dissipation fins being spaced from each other in a spacing direction that is perpendicular to the planes of the plates of the heat dissipation fins;

at least one bent section arranged at one side of at least one of the heat dissipation fins and extending, in a direction that is non-parallel with the plane of the plate of the heat dissipation, from the bottom edge of the heat dissipation fin, the bent section being located on the addin card;

at least one gap section formed between each bent section to allow air to flow therethrough in the vertical direction such that air is allowed to flow between the top and bottom edges of the heat dissipation fin; and at least one first through-hole section formed in the heat dissipation fins to allow air to flow therethrough in the spacing direction that is not parallel to the vertical direction;

wherein the heat dissipation fins are provided with at least one fan arranged thereon and positioned on the top edges of the plates of the heat dissipation fins to cause air to flow between the heat dissipation fins in the vertical direction;

wherein the heat dissipation fins comprise at least one second through-hole section formed therein; and wherein the second through-hole section receives at least one heat conducting pipe extending therethrough in a direction that is not parallel to the planes of the plates of the heat dissipation fins to couple the heat dissipation fins to each other.

2. The heat dissipation structure of the addin card according to claim 1, wherein the heat dissipation fins and the addin card comprise at least one heat-conducting element arranged therebetween.

3. The heat dissipation structure of the addin card according to claim 2, wherein the heat-conducting element is formed of a metallic material.

4. The heat dissipation structure of the addin card according to claim 1, wherein the heat dissipation fins are formed of a metallic material.

5. The heat dissipation structure of the addin card according to claim 1, wherein the heat dissipation fins and the addin card comprise at least one heat-conduction bottom board arranged therebetween.

* * * * *